(12) United States Patent
Kim

(10) Patent No.: US 11,255,883 B2
(45) Date of Patent: Feb. 22, 2022

(54) DEVICE FOR DETECTING CURRENT LEAKAGE AND CURRENT LEAKAGE DETECTION SYSTEM INCLUDING THE SAME

(71) Applicants: Hyundai Motor Company, Seoul (KR); Kia Motors Corporation, Seoul (KR)

(72) Inventor: Ju Han Kim, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 16/737,421

(22) Filed: Jan. 8, 2020

(65) Prior Publication Data
US 2021/0033645 A1 Feb. 4, 2021

(30) Foreign Application Priority Data
Aug. 2, 2019 (KR) .......................... 10-2019-0094520

(51) Int. Cl.
| | |
|---|---|
| G01R 15/20 | (2006.01) |
| G01R 33/07 | (2006.01) |
| G01R 31/364 | (2019.01) |
| H01M 8/04537 | (2016.01) |
| G01R 31/52 | (2020.01) |

(52) U.S. Cl.
CPC ......... *G01R 15/202* (2013.01); *G01R 31/364* (2019.01); *G01R 31/52* (2020.01); *G01R 33/07* (2013.01); *H01M 8/04641* (2013.01); *H01M 8/04656* (2013.01); *H01M 2250/20* (2013.01)

(58) Field of Classification Search
CPC .. G01R 33/07; G01R 31/364; H01M 8/04656
See application file for complete search history.

(56) References Cited

U.S. PATENT DOCUMENTS

| | | | |
|---|---|---|---|
| 9,411,021 B2 | 8/2016 | Suchoff | |
| 2001/0048310 A1* | 12/2001 | Takahashi | G01R 31/346 324/551 |
| 2007/0210847 A1* | 9/2007 | Baudesson | H02M 1/12 327/283 |
| 2011/0204831 A1* | 8/2011 | Iwaji | H02P 21/04 318/244 |
| 2014/0063872 A1* | 3/2014 | Hamza | H02M 1/44 363/39 |
| 2015/0301127 A1* | 10/2015 | Suchoff | G01R 19/165 324/764.01 |

FOREIGN PATENT DOCUMENTS

| | | |
|---|---|---|
| JP | 5707508 B2 | 4/2015 |
| KR | 10-1650615 B1 | 8/2016 |
| KR | 101836651 B1 | 3/2018 |

\* cited by examiner

*Primary Examiner* — Alvaro E Fortich
(74) *Attorney, Agent, or Firm* — Mintz Levin Cohn Ferris Glovsky and Popeo, P.C.; Peter F. Corless

(57) ABSTRACT

A device for detecting a current leakage and a current leakage detection system including the same are provided. The device for detecting a current leakage includes a magnetic core having an internal space and both ends the core are separated from each other. An electric wiring extends to pass through the internal space of the magnetic core, and is connected between a power source and an electric load to supply power from the power source to the electric load. A hall sensor senses a magnetic field induced in the magnetic core.

11 Claims, 7 Drawing Sheets

DEVICE FOR DETECTING CURRENT LEAKAGE AND CURRENT LEAKAGE DETECTION SYSTEM INCLUDING THE SAME

CROSS REFERENCE TO RELATED APPLICATION

The present application claims priority to Korean Patent Application No. 10-2019-0094520, filed Aug. 2, 2019, the entire contents of which is incorporated herein for all purposes by this reference.

BACKGROUND

1. Technical Field

The present disclosure relates to a device for detecting a current leakage and a current leakage detection system including the same, and more particularly, to a system for sensing a current leakage in a vehicle and detecting a location having a risk of electric shock.

2. Description of the Related Art

Along with the concerns about oil depletion and environmental pollution, various eco-friendly vehicles such as hybrid vehicles, electric vehicles and fuel cell vehicles are being developed. The eco-friendly vehicle may include an engine such as an internal combustion engine, but is equipped with a power storage for providing power required to drive a motor as a main power source or an auxiliary power source, for example, a high voltage battery capable of being charged or discharged.

Particularly, the eco-friendly vehicle includes a high voltage battery and high voltage loads that consume the power supplied therefrom. Conventionally, there was a problem in that only a combined insulation resistance could be diagnosed in the entire vehicle, and individual insulation resistances of those high voltage loads were unable to be determined, and thus it was difficult to detect a location of current leakage.

The contents described as the related art have been provided merely to assist in understanding the background of the present disclosure and should not be considered as corresponding to the related art known to those having ordinary skill in the art.

SUMMARY

The present disclosure provides a device for detecting a current leakage capable of detecting a location where the current leakage occurs, and a current leakage detection system including the same.

According to an exemplary embodiment of the present disclosure, a device for detecting a current leakage may include: a magnetic core having an internal space, with both ends thereof being separated from each other; an electric wiring that extends to pass through the internal space of the magnetic core, and connected between a power source and an electric load to supply power from the power source to the electric load; and a hall sensor configured to sense a magnetic field induced in the magnetic core.

The magnetic core may be bent in a ring shape, with the both ends thereof being spaced apart from each other, and the hall sensor may be disposed between the both ends of the magnetic core. The electric wiring may include a positive electrode wiring and a negative electrode wiring connecting positive electrodes and negative electrodes of the power source and the electric load, respectively.

The device for detecting a current leakage may further include a detection unit. The positive electrode wiring and the negative electrode wiring may be disposed together in the magnetic core, and the hall sensor may be configured to sense a magnetic field induced due to a current difference between the positive electrode wiring and the negative electrode wiring. The detection unit may be configured to detect whether there is a current leakage in the electric load based on a magnitude of the magnetic field sensed by the hall sensor.

The device for detecting a current leakage may further include a detection unit. The magnetic core may include a first magnetic core in which the positive electrode wiring is located and a second magnetic core in which the negative electrode wiring is located, and the hall sensor may include a first hall sensor configured to sense a magnetic field of the first magnetic core and a second hall sensor configured to sense a magnetic field of the second magnetic core. The detection unit may be configured to detect whether there is a current leakage in the electric load, based on magnitudes of the respective magnetic fields sensed by the first hall sensor and the second hall sensor.

According to another exemplary embodiment of the present disclosure, a current leakage detection system may include: the device configured to detect a current leakage as described above; a high voltage battery discharged by supplying charged power; a main bus terminal electrically connected to the high voltage battery and branched into the electric wiring; and a detection unit configured to detect whether there is a current leakage in the electric load, based on a magnitude of the magnetic field sensed by the hall sensor. The magnetic core and the hall sensor may be disposed on the electric wiring branched from the main bus terminal.

The electric load may be included in a plural number, and a plurality of electric wirings may be branched from the main bus terminal and connected to the plurality of electric loads respectively. The magnetic core and the hall sensor may be provided on each of the electric wirings connected from the main bus terminal to each of the electric loads. A positive electrode wiring and a negative electrode wiring may be disposed together in the magnetic core, and the hall sensor may be configured to sense a magnetic field induced due to a current difference between the positive electrode wiring and the negative electrode wiring. When the magnitude of the magnetic field sensed by the hall sensor is equal to or greater than a predetermined magnitude, the detection unit may be configured to detect that a current leakage has occurred in the electric load.

The current leakage detection system may further include a fuel cell supplied with hydrogen and oxygen and generating power. The main bus terminal may be connected between the fuel cell and the high voltage battery, and the power source may be the fuel cell or the high voltage battery. The current leakage detection system may further include: a battery magnetic core disposed on a side where the high voltage battery is disposed based on a point at which the main bus terminal is branched toward the electric load, and having a charging/discharging wiring for charging or discharging the high voltage battery therein; and a battery hall sensor configured to sense a magnetic field induced in the battery magnetic core. The detection unit may be configured to detect whether there is a current leakage in the high voltage battery, based on a magnitude of the magnetic field sensed by the battery hall sensor.

The current leakage detection system may further include a measurement unit configured to measure a combined insulation resistance of the fuel cell, the high voltage battery and the electric load. When the combined insulation resistance measured by the measurement unit is equal to or less than a predetermined resistance and no current leakage is detected in the electric load and the high voltage battery, the detection unit may be configured to detect that a current leakage has occurred in the fuel cell. The current leakage detection system may further include a cutoff controller configured to cut off power supply from the main bus terminal to the electric load when the detection unit detects a current leakage in the electric load.

BRIEF DESCRIPTION OF THE DRAWINGS

The objects, features and advantages of the present invention will be more apparent from the following detailed description in conjunction with the accompanying drawings, in which.

DETAILED DESCRIPTION

Figure 1:
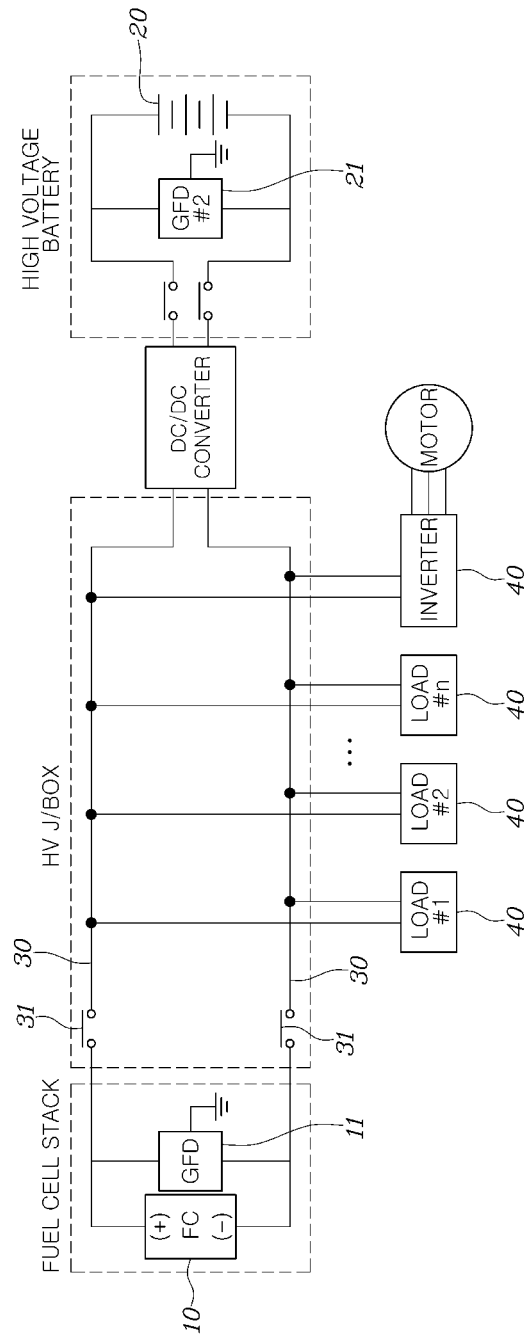
FIG. 1 illustrates a configuration diagram of a system for detecting a current leakage in a fuel cell according to the related art.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present disclosure may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Specific structural or functional descriptions of embodiments of the present disclosure disclosed in the present specification or application are merely given for the purpose of describing exemplary embodiments according to the present disclosure. Exemplary embodiments according to the present disclosure may be implemented in various forms and are not to be construed as being limited to the exemplary embodiments described in the present specification or application.

Since the exemplary embodiments according to the present disclosure may be modified in various ways and take on various alternative forms, particular embodiments will be illustrated in the drawings and described in detail in the present specification or application. However, there is no intent to limit exemplary embodiments according to the concept of the present disclosure to the particular forms disclosed, and the present disclosure should be construed as covering all modifications, equivalents, and alternatives included in the spirit and technical scope of the present disclosure.

It should be understood that, although the terms "first", "second", and the like may be used herein to describe various elements, the elements are not limited by the terms. The terms are used only for the purpose of distinguishing one element from another element. For example, a first element may be referred to as a second element, and similarly, a second element may be referred to as a first element, without departing from the scope according to the concept of the present disclosure.

When a certain element is referred to as being "connected" or "coupled" to another element, although the certain element may be directly connected or coupled to the other element, it should be understood that another intervening element may exist therebetween. On the other hand, when a certain element is referred to as being "directly connected" or "directly coupled" to another element, it should be understood that no intervening element exists therebetween. Other expressions for describing a relationship between elements, i.e. "between", "directly between", "adjacent to", "directly adjacent to", and the like, should also be construed in the same manner.

Unless defined otherwise, all terms used herein, including technical and scientific terms, have the same meaning as commonly understood by those having ordinary skill in the art to which the present disclosure pertains. Terms such as those defined in generally used dictionaries should be interpreted to have meanings consistent with the contextual meanings in the relevant art, and are not to be interpreted to have ideal or excessively formal meanings unless clearly defined in the present specification.

Hereinafter, the present disclosure will be described in detail by describing preferred embodiments of the present disclosure with reference to the accompanying drawings. Identical reference marks shown in each drawing are used to denote identical elements.

FIG. 1 illustrates a configuration diagram of a system for detecting a current leakage in a fuel cell according to the related art. Referring to FIG. 1, a fuel cell 10 and a high voltage battery 20 are connected to a main bus terminal 30, and a relay 31 is formed at the main bus terminal 30 to cut off electrical connection between the fuel cell 10 and the main bus terminal 30 in a power generation stop mode of the fuel cell 10 (FC stop mode).

Accordingly, the main bus terminal 30 includes ground fault detectors (GFDs) 11 and 21 configured to measure insulation resistances on a side where the fuel cell 10 is disposed and on a side where the high voltage battery 20 is disposed, respectively, based on the relay 31. In other words, the ground fault detectors 11 and 21 are disposed on the side where the fuel cell 10 is disposed and on the side where the high voltage battery 20 is disposed, respectively, so that the ground fault detector 11 monitors a combined insulation resistance in a vehicle in a power generation mode of the fuel cell 10 on the side where the fuel cell is disposed, and the relay 31 is cut off in the power generation stop mode of the fuel cell (FC stop mode) and the ground fault detector 21 is configured to monitor a combined insulation resistance in the vehicle on the side where the high voltage battery is disposed.

In particular, the conventional ground fault detectors 11 and 21 configured to measure a combined insulation resistance are not capable of measuring individual insulation resistances of the power sources 10, 20 and the electrical loads 40, and monitor a combined insulation resistance where all of the individual insulation resistances are combined as follows.

$$\frac{1}{R_+} = \frac{1}{R_{S+}} + \frac{1}{R_{1+}} + \frac{1}{R_{2+}} + \frac{1}{R_{3+}}$$

$$\frac{1}{R_-} = \frac{1}{R_{S-}} + \frac{1}{R_{1-}} + \frac{1}{R_{2-}} + \frac{1}{R_{3-}}$$

In other words, according to the related art, since the combined insulation resistance is measured for monitoring, the related art may only determine whether a current leakage occurs in the entire vehicle, and it is not possible to detect a specific location where the current leakage occurs. In addition, since the ground fault detectors 11 and 21 config-ured to measure a combined insulation resistance should be provided on the side where the fuel cell 10 is disposed and on the side where the high voltage battery 20 is disposed, respectively, the resultant increase in cost is inevitable.

Figure 2:
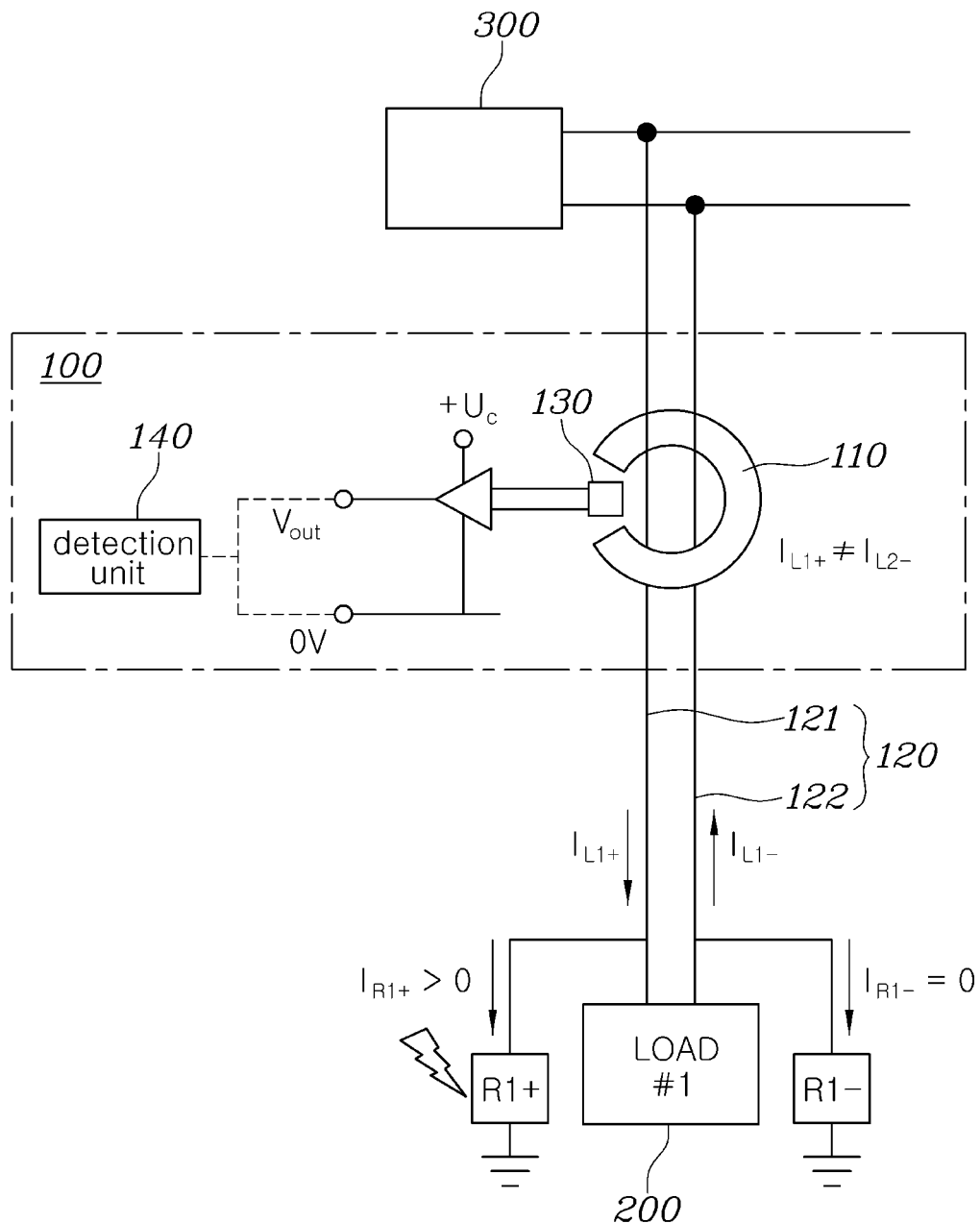
FIGS. 2 and 3 illustrate configurations of devices for detecting a current leakage according to an exemplary embodiment of the present disclosure.
Figure 3:
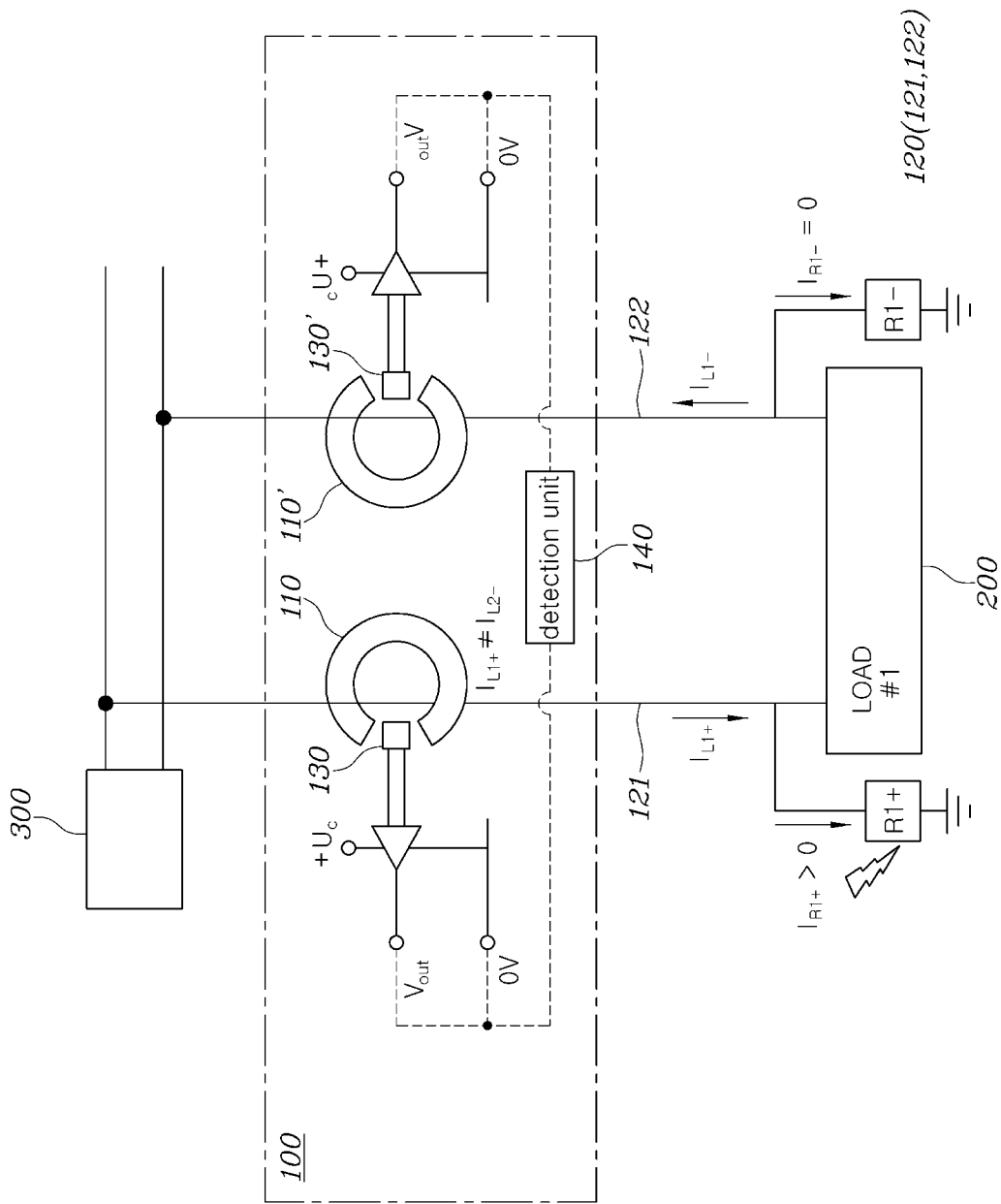

FIGS. 2 and 3 illustrate configurations of devices for detecting a current leakage according to an exemplary embodiment of the present disclosure. Referring further to FIGS. 2 and 3, the device for detecting a current leakage according to an exemplary embodiment of the present disclosure may include: a magnetic core 110 having an internal space, with both ends thereof being separated from each other; an electric wiring 120 that extends to pass through the internal space of the magnetic core 110 and connected between a power source 300 and an electric load 200 to supply power from the power source 300 to the electric load 200; and a hall sensor 130 configured to sense a magnetic field induced in the magnetic core 110.

The magnetic core 110 may be made of a material that is capable of inducing a magnetic field by a current. The magnetic core 110 may be a magnetic material inserted into a coil and used to increase a magnetic flux. Silicon, a high permeability alloy such as permalloy, or ferrite may be used therefor. The magnetic core 110 may be bent in a state in which both ends thereof are separated from each other, not contacting each other, with an internal space to have an empty space therein. An electric wiring 120 may be accommodated within the internal space.

The electric wiring 120 may extend for connection between the power source 300 and the electrical load 200. The power source 300 may be direct current power or alternating current power, and the electric wiring 120 may include a positive electrode wiring 121 and a negative electrode wiring 122. The electric wiring 120 may be disposed in the internal space of the magnetic core 110. The hall sensor 130 may be disposed adjacent to the magnetic core 110 to sense a magnetic field induced in the magnetic core 110. Particularly, the hall sensor 130 may be configured to measure a voltage proportional to a magnitude of the magnetic field by using the Hall effect caused by the magnetic field. In other words, the hall sensor 130 may be configured to sense a voltage as a magnitude of the magnetic field. The hall sensor 130 may further include an amplifier configured to amplify a voltage generated.

Accordingly, the device for detecting a current leakage according to an exemplary embodiment of the present disclosure is applicable to both the alternating current power and the direct current power, and is capable of sensing a magnetic field induced by the current in the electric wiring 120, thereby detecting a current leakage in the corresponding electric load 200. More specifically, the magnetic core 110 may be bent in a ring shape, with both ends thereof being spaced apart from each other, and the hall sensor 130 may be disposed between the both ends of the magnetic core 110. In other words, the magnetic core 110 may be bent in a ring shape (annular shape), and the both ends thereof may be separated and spaced apart from each other. In addition, the hall sensor 130 may be disposed between the both ends of the magnetic core 110, which are spaced apart from each other, to measure a magnetic field induced in the magnetic core 110.

The electric wiring 120 may include a positive electrode wiring 121 and a negative electrode wiring 122 connecting positive electrodes and negative electrodes of the power source 300 and the electric load 200, respectively. When the power source 300 supplies direct current power, each of the positive electrode wiring 121 and the negative electrode wiring 122 of the electric wire 120 may be established.

When the power source 300 supplies alternating current power, the positive electrode wiring 121 and the negative electrode wiring 122 may be changed with each other in real time.

According to an exemplary embodiment as shown in FIG. 2, the device for detecting a current leakage may further include a detection unit 140. The detection unit 140 may be operated by a controller discussed herein. The positive electrode wiring 121 and the negative electrode wiring 122 may be disposed together in the magnetic core 110, and the hall sensor 130 may be configured to sense a magnetic field induced due to a current difference between the positive electrode wiring 121 and the negative electrode wiring 122. The detection unit may be configured to detect whether there is a current leakage in the electric load 200 based on a magnitude of the magnetic field sensed by the hall sensor 130.

When If there is no current leakage in the electric load 200, it may be assumed that currents in the positive electrode wiring 121 and the negative electrode wiring 122 are at the same level. When a current leakage occurs in the electric load 200, however, a current difference is caused between the positive electrode wiring 121 and the negative electrode wiring 122. If the current difference between the positive electrode wiring 121 and the negative electrode wiring 122 is zero (0), they have the same magnitude of current flowing in different directions from each other. Hence, the magnetic fields thereof are offset against each other, and thereby no magnetic field may be induced in the magnetic core 110. Accordingly, the magnitude of the magnetic field sensed by the hall sensor 130 may be zero (0).

The detection unit 140 may be configured to detect whether there is a current leakage in the electric load 200, based on the magnitude of the magnetic field sensed by the hall sensor 130. In consideration of a difference in location between the positive electrode wiring 121 and the negative electrode wiring 122, a measurement error, and the like, if the magnitude of the magnetic field sensed by the hall sensor 130 (that is, the magnitude of the voltage) is equal to or greater than a predetermined magnitude, a current leakage may be determined to occur in the electric load 200. On the contrary, if the magnitude of the magnetic field sensed by the hall sensor 130 (that is, the magnitude of the voltage) is less than the predetermined magnitude, it may be determined that no current leakage occurs in the electric load 200.

According to another exemplary embodiment as illustrated in FIG. 3, the device for detecting a current leakage may further include a detection unit 140. The magnetic core 110 may include a first magnetic core 110 in which the positive electrode wiring 121 is disposed and a second magnetic core 110' in which the negative electrode wiring 122 is disposed, and the hall sensor 130 may include a first hall sensor 130 configured to sense a magnetic field of the first magnetic core 110 and a second hall sensor 130' configured to sense a magnetic field of the second magnetic core 110'. The detection unit 140 may be configured to detect whether there is a current leakage in the electric load 200, based on magnitudes of the respective magnetic fields sensed by the first hall sensor 130 and the second hall sensor 130'.

In other words, the first magnetic core 110 and the second magnetic core 110' may be provided to separately dispose the positive electrode wiring 121 and the negative electrode wiring 122 in the respective inner spaces thereof (e.g., separate the positive and negative electrode wirings from each other). The first hall sensor 130 may be configured to sense a magnetic field of the first magnetic core 110, and the second hall sensor 130' may be configured to sense a magnetic field of the second magnetic core 110'. The detection unit 140 may be configured to compare the magnitudes of the respective magnetic fields sensed by the first hall sensor 130 and the second hall sensor 130', thereby comparing the magnitudes of the respective currents flowing in the positive electrode wiring 121 and the negative electrode wiring 122.

If a difference between the magnitudes of the respective magnetic fields (that is, the magnitudes of the voltages) sensed by the first hall sensor 130 and the second hall sensor 130' is equal to or greater than a predetermined level, the detection unit 140 may be configured to detect that a current leakage occurs in the electric load 200. On the contrary, if the difference between the magnitudes of the respective magnetic fields (that is, the magnitudes of the voltages) sensed by the first hall sensor 130 and the second hall sensor 130' is less than the predetermined level, the detection unit 140 may be configured to determine that no current leakage occurs in the electric load 200.

Figure 4:
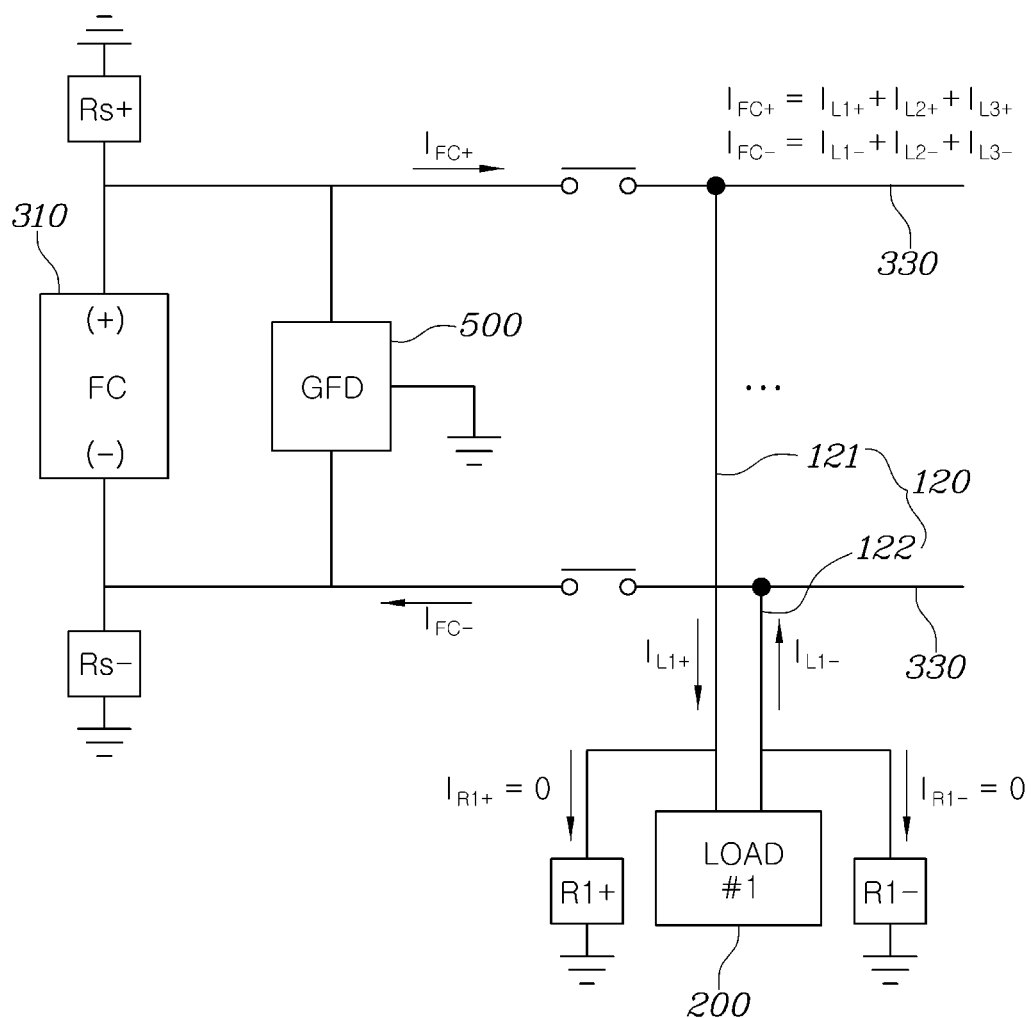
FIG. 4 illustrates a state in which no current leakage occurs in an electric load included in a fuel cell system according to an exemplary embodiment of the present disclosure.
Figure 5:
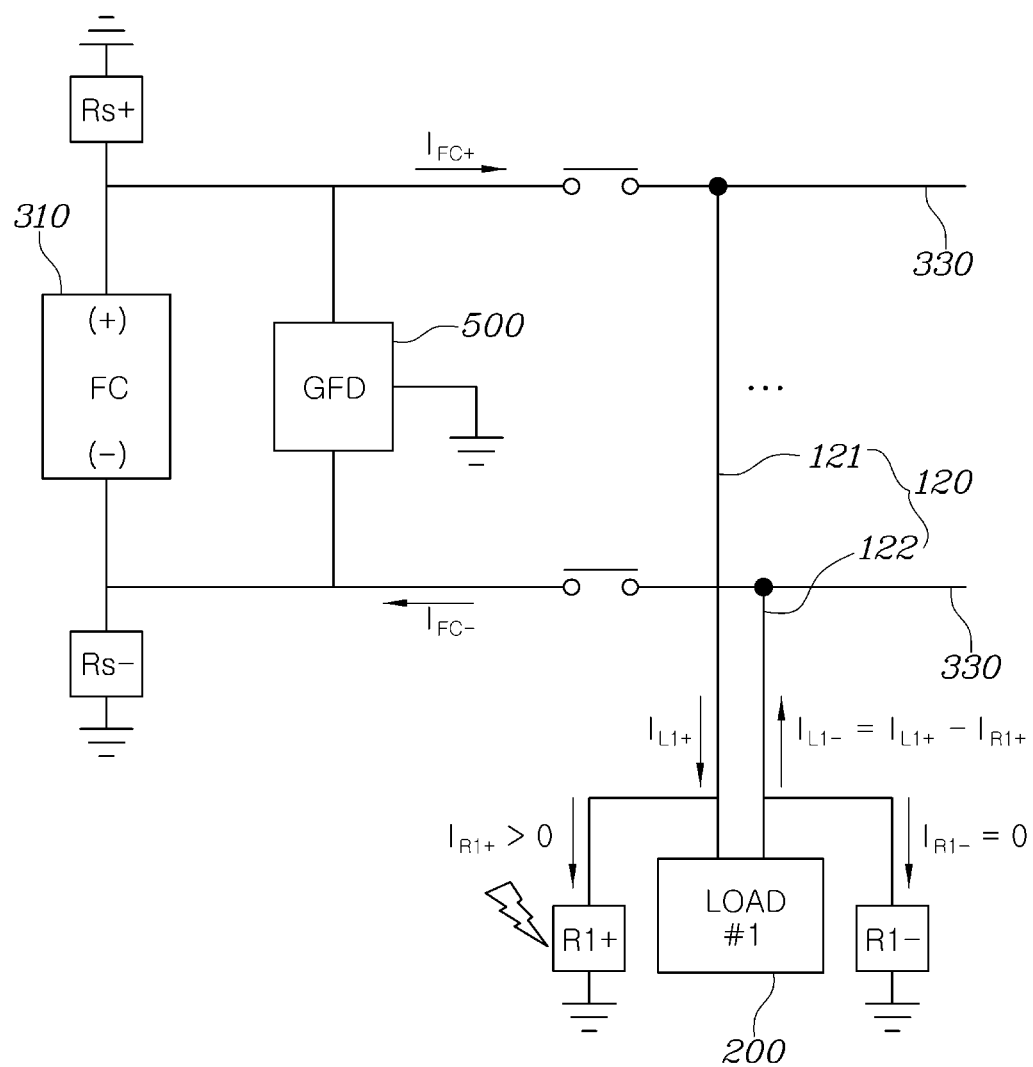
FIG. 5 illustrates a state in which a current leakage occurs in an electric load included in a fuel cell system according to an exemplary embodiment of the present disclosure.
Figure 6:
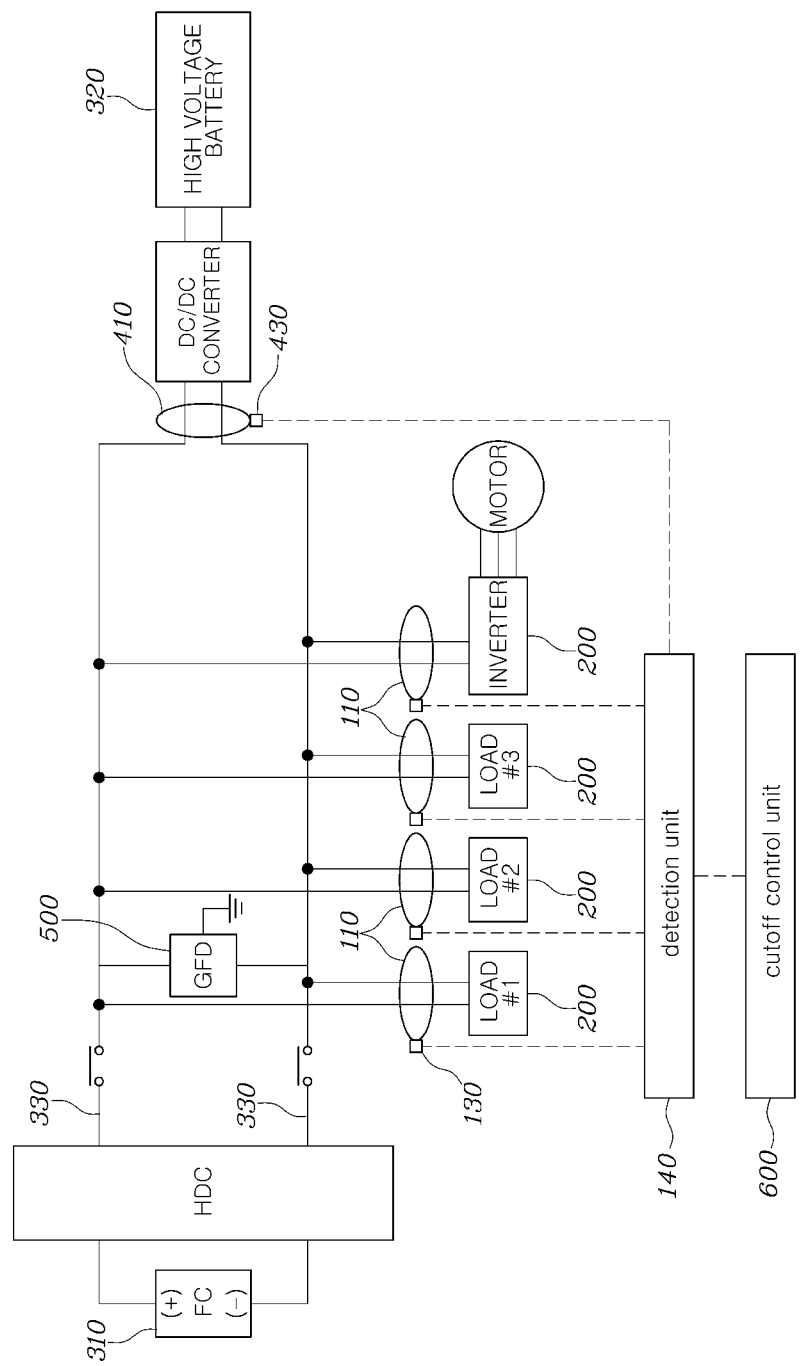
FIG. 6 is a configuration diagram of a system for detecting a current leakage in a fuel cell according to an exemplary embodiment of the present disclosure.

FIG. 4 illustrates a state in which no current leakage occurs in an electric load 200 included in a fuel cell 310 system, FIG. 5 illustrates a state in which a current leakage occurs in an electric load 200 included in a fuel cell 310 system, and FIG. 6 is a configuration diagram of a system for detecting a current leakage in a fuel cell 310 according to an exemplary embodiment of the present disclosure. Referring further to FIGS. 4 to 6, a current leakage detection system according to an exemplary embodiment of the present disclosure may include: the device configured to detect a current leakage; a fuel cell 310 supplied with hydrogen and oxygen and generating power; a high voltage battery 320 charged with the power that is generated in the fuel cell 310 or discharged by supplying the charged power; a main bus terminal 330 for electrical connection between the fuel cell 310 and the high voltage battery 320; and a detection unit 140 configured to detect whether there is a current leakage in an electric load 200, based on the magnitude of the magnetic field sensed by the hall sensor 130.

The power source 300 is the fuel cell 310 or the high voltage battery 320. The electric wiring 120 is branched from the main bus terminal 330 and connected to the electric load (200), and the magnetic core 110 and the hall sensor 130 may be disposed on the electric wiring 120 branched from the main bus terminal 330. The fuel cell 310 may be supplied with hydrogen and oxygen, and may be configured to generate power by subjecting the hydrogen and oxygen to a chemical reaction therein. The fuel cell 310 may be electrically connected to the high voltage battery 320 via the main bus terminal 330.

The high voltage battery 320 may be charged by being supplied with the power generated in the fuel cell 310 through the main bus terminal 330, or the high voltage battery 320 may be configured to supply power to the main bus terminal 330 while being discharged. The electric wiring 120 may be branched from the main bus terminal 330, and the electric wiring 120 may be connected to the electric load 200. In other words, the power source 300 supplying power to the electric load 200 may be the fuel cell 310 or the high voltage battery 320.

The magnetic core 110 and the hall sensor 130 may be disposed on the electric wiring 120 branched from the main bus terminal 330 and connected to the electric load 200. Accordingly, it may be possible to detect a leakage current in the electric load 200 connected to the main bus terminal 330. More specifically, a plurality of electric loads 200 may be provided, and a plurality of electric wirings 120 may be branched from the main bus terminal 330 and connected to the plurality of electric loads 200, respectively. The magnetic core 110 and the hall sensor 130 may be disposed on each of the electric wirings 120 connected from the main bus terminal 330 to each of the electric loads 200.

Particularly, the electric load 200 may be an inverter connected to a motor, or auxiliary machinery for circulating a coolant such as a coolant pump and a cooling fan. In other words, the magnetic core 110 and the hall sensor 130 may be disposed on each of the plurality of electric wirings 120 branched from the main bus terminal 330 and connected to each of the plurality of electric loads 200, thereby making it possible to detect a current leakage occurring in the corresponding electric load 200. Accordingly, it may be possible to detect a location where a current leakage occurs.

The positive electrode wiring 121 and the negative electrode wiring 122 may be disposed together in the magnetic core 110, and the hall sensor 130 may be configured to sense a magnetic field induced due to a current difference between the positive electrode wiring 121 and the negative electrode wiring 122. If the magnitude of the magnetic field sensed by the hall sensor 130 is equal to or greater than a predetermined magnitude, the detection unit 140 may be configured to detect that a current leakage has occurred in the electric load 200. In particular, by using a voltage sensed by the hall sensor 130 based on the magnitude of the magnetic field induced in the magnetic core 110, the detection unit 140 may be configured to determine whether a current leakage has occurred in the electric load 200 based on the magnitude of the voltage.

The current leakage detection system may further include: a battery magnetic core 410 disposed on a side where the high voltage battery 320 is disposed based on a point at which the main bus terminal 330 is branched toward the electric load 200, and having a charging/discharging wiring for charging or discharging the high voltage battery 320 therein; and a battery hall sensor 430 configured to sense a magnetic field induced in the battery magnetic core 410. The detection unit 140 may be configured to detect whether there is a current leakage in the high voltage battery 320, based on a magnitude of the magnetic field sensed by the battery hall sensor 430.

The battery magnetic core 410 and the battery hall sensor 430 may be disposed on the main bus terminal 330 that connects the fuel cell 310 and the high voltage battery 320. In other words, the electric wiring 120 may be the main bus terminal 330. Particularly, the battery magnetic core 410 and the battery hall sensor 430 may be disposed on the main bus terminal 330 on the side where the high voltage battery 320 is disposed, with respect to the point at which the main bus terminal 330 is branched to be connected to the electric load 200. Accordingly, whether there is a leakage of a current flowing from the main bus terminal 330 to the high voltage battery 320 or flowing from the high voltage battery 320 to the main bus terminal 330 may be detected. The battery magnetic core 410 and the battery hall sensor 430 may be applied on the same principle as the magnetic core 110 and the hall sensor 130 described above. Accordingly, it may be possible to detect a current leakage that occurs in the high voltage battery 320.

The current leakage detection system may further include a measurement unit 500 configured to measure a combined insulation resistance of the fuel cell 310, the high voltage battery 320 and the electric load 200. If the combined insulation resistance measured by the measurement unit 500 is equal to or less than a predetermined resistance and no current leakage is detected in the electric load 200 and the high voltage battery 320, the detection unit 140 may be configured to detect that a current leakage has occurred in the fuel cell 310.

The measurement unit 500 may be a ground fault detector (GFD) configured to measure an insulation resistance, and may be disposed on the main bus terminal 330 connecting the fuel cell 310 and the high voltage battery 320 to measure a combined insulation resistance of the fuel cell 310, the high voltage battery 320 and the electric load 200. Particularly, the measurement unit 500 may be disposed on the side where the high voltage battery 320 is disposed with respect to the relay of the main bus terminal 330.

The detection unit 140 may be configured to determine whether the combined insulation resistance measured by the measurement unit 500 is equal to or less than the predetermined resistance. If the combined insulation resistance measured by the measurement unit 500 is equal to or less than the predetermined resistance, a current leakage may be detected in at least one of the fuel cell 310, the high voltage battery 320, and the electric load 200.

In an exemplary embodiment, the detection unit 140 may be configured to detect a current leakage in the electric load 200 using the hall sensor 130 or detect a current leakage in the high voltage battery 320 using the battery hall sensor 430, when the combined insulation resistance measured by the measuring unit 500 is equal to or less than the predetermined resistance. In addition, when no current leakage is detected in the electric load 200 and the high voltage battery 320, the detection unit 140 may be configured to detect that the current leakage has occurred in the fuel cell 310. Accordingly, it may be possible to detect a current leakage even in the fuel cell 310 as well as in the electric load 200 and the high voltage battery 320, by using a single detection unit 140.

When a current leakage is detected, the detection unit 140 may be configured to inform a driver of the current leakage by outputting a notification such as operating a warning lamp or the like, and may also be configured to store in a memory a location where the current leakage is detected. Accordingly, it may be possible to improve maintainability of a vehicle employing a fuel cell 310. The current leakage detection system may further include a cutoff controller 600 configured to cut off power supply from the main bus terminal 330 to the electric load 200 when a current leakage in the electric load 200 is detected by the detection unit 140.

When a current leakage in the electric load 200 is detected, the cutoff controller 600 may be configured to cut off the power supply to the electric load 200 in which the current leakage has occurred. In addition, in response to detecting that a current leakage occurs in the high voltage battery 320, the cutoff controller 600 may be configured to discharge the high voltage battery 320 and stop further charging.

Figure 7:
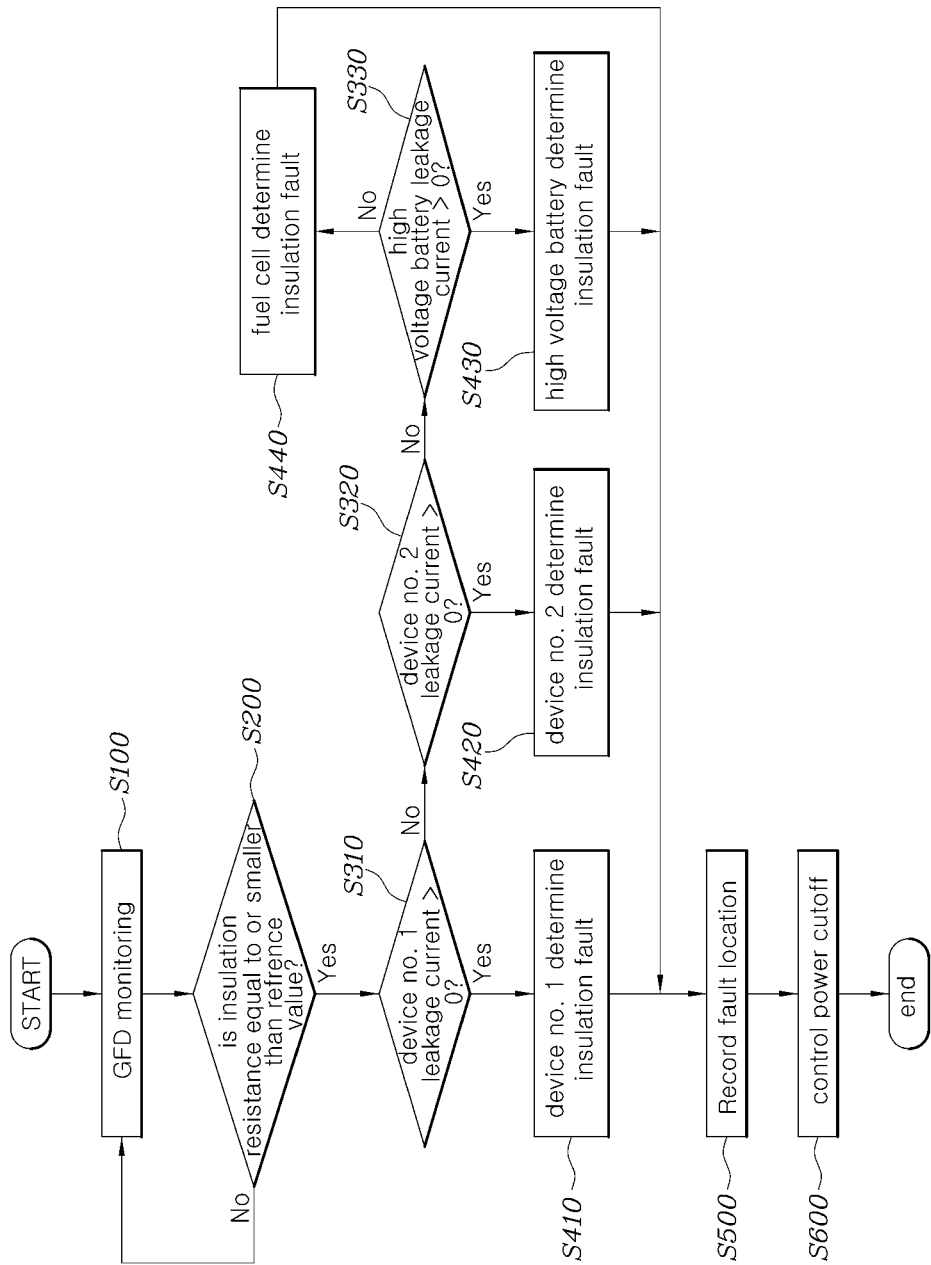
FIG. 7 is a method of detection by the system for detecting a current leakage in a fuel cell according to an exemplary embodiment of the present disclosure.

FIG. 7 is a method of detection by the system for detecting a current leakage in a fuel cell 310 according to an exemplary embodiment of the present disclosure. The method described herein below may be executed by a controller having a processor and memory. Referring further to FIG. 7, the method of detection by the system for detecting a current leakage in a fuel cell 310 according to an exemplary embodiment of the present disclosure may include: monitoring a combined insulation resistance using the measurement unit 500 that is a ground fault detector (GFD) configured to measure an insulation resistance (S100); determining whether the monitored combined insulation resistance is equal to or less than a predetermined resistance (S200); and if the combined insulation resistance is equal to or less than the predetermined resistance, determining that a current leakage has occurred and detecting the current leakage (S310, S320 and S330).

In the detecting of the current leakage (S310, S320 and S330), current leakages in the electric loads 200 branched and connected from the main bus terminal 330 may be individually detected (S310 and S320), and a current leakage in the high voltage battery 320 may be detected. In the detecting of the current leakage (S310, S320 and S330), in response to determining that no current leakage has occurred in all of the electric loads 200 and the high voltage battery 320 (S410, S420 and S430), a current leakage may be determined to have occurred in the fuel cell 310 (S440).

After the detecting of the current leakage (S310, S320 and S330), a location where the current leakage has occurred (the electric load 200, the high voltage battery 320, or the fuel cell 310) may be stored in a memory, and a driver may be informed of the current leak using a warning lamp or the like (S500). In addition, after the detecting of the current leakage (S310, S320 and S330), the detection method may further include cutting off power supply to the electric load 200 in response to determining that a current leakage has occurred therein (S600).

According to the device for detecting a current leakage and the system for detecting a current leakage in a fuel cell of the present disclosure, it may be possible to detect a location where a current leakage occurs. Additionally, the current leakage detection system according to the present disclosure requires only one measurement unit measuring a combined insulation resistance, and accordingly it may be possible to reduce the manufacturing cost.

Although the present disclosure has been shown and described with respect to specific embodiments, it will be apparent to those having ordinary skill in the art that the present disclosure may be variously modified and altered without departing from the spirit and scope of the present disclosure as defined by the following claims.

What is claimed is:

1. A device for detecting a current leakage, comprising:
    a magnetic core having an internal space, with both ends thereof being separated from each other;
    an electric wiring that extends to pass through the internal space of the magnetic core, and connected between a power source and an electric load to supply power from the power source to the electric load;
    a hall sensor configured to sense a magnetic field induced in the magnetic core; and
    a detection unit,
    wherein the electric wiring includes a positive electrode wiring and a negative electrode wiring connecting positive electrodes and negative electrodes of the power source and the electric load, respectively,
    wherein the positive electrode wiring and the negative electrode wiring are disposed together in the magnetic core, the hall sensor is configured to sense a magnetic field induced due to a current difference between the positive electrode wiring and the negative electrode wiring, and
    wherein the detection unit is configured to detect whether there is a current leakage in the electric load based on a magnitude of the magnetic filed sensed by the hall sensor.

2. The device of claim 1, wherein the magnetic core is bent in a ring shape, with the both ends thereof being spaced apart from each other, and the hall sensor is disposed between the both ends of the magnetic core.

3. A device for detecting a current leakage, comprising:
    a magnetic core having an internal space, with both ends thereof being separated from each other;
    an electric wiring that extends to pass through the internal space of the magnetic core, and connected between a power source and an electric load to supply power from the power source to the electric load;
    a hall sensor configured to sense a magnetic field induced in the magnetic core; and
    a detection unit,
    wherein the electric wiring includes a positive electrode wiring and a negative electrode wiring connecting positive electrodes and negative electrodes of the power source and the electric load, respectively,
    wherein the magnetic core includes a first magnetic core in which the positive electrode wiring is disposed and a second magnetic core in which the negative electrode wiring is disposed, the hall sensor includes a first hall sensor configured to sense a magnetic field of the first magnetic core and a second hall sensor configured to sense a magnetic field of the second magnetic core, and
    wherein the detection unit is configured to detect whether there is a current leakage in the electric load, based on magnitudes of the respective magnetic fields sensed by the first hall sensor and the second hall sensor.

4. A current leakage detection system, comprising:
    a device configured to detect a current leakage, including:
        a magnetic core having an internal space, with both ends thereof being separated from each other;
        at least one electric wiring that extends to pass through the internal space of the magnetic core, and connected between a power source and at least one electric load to supply power from the power source to the electric load; and
        a hall sensor configured to sense a magnetic field induced in the magnetic core a high voltage battery discharged by supplying charged power;
    a main bus terminal electrically connected to the high voltage battery and branched into the electric wiring; and
    a detection unit configured to detect whether there is a current leakage in the electric load, based on a magnitude of the magnetic field sensed by the hall sensor,
    wherein the magnetic core and the hall sensor are disposed on the electric wiring branched from the main bus terminal.

5. The current leakage detection system of claim 4, further comprising a plurality of electric loads and a plurality of electric wirings branched from the main bus terminal and connected to the plurality of electric loads respectively, and the magnetic core and the hall sensor are disposed on each of the electric wirings connected from the main bus terminal to each of the electric loads.

6. The current leakage detection system of claim 4, wherein a positive electrode wiring and a negative electrode wiring are disposed together in the magnetic core, and the hall sensor is configured to sense a magnetic field induced due to a current difference between the positive electrode wiring and the negative electrode wiring.

7. The current leakage detection system of claim 6, wherein the detection unit is configured to detect that a current leakage has occurred in the electric load if the magnitude of the magnetic field sensed by the hall sensor is equal to or greater than a predetermined magnitude.

8. The current leakage detection system of claim 4, further comprising:
    a fuel cell supplied with hydrogen and oxygen and configured to generate power, wherein the main bus terminal is connected between the fuel cell and the high voltage battery, and the power source is the fuel cell or the high voltage battery.

9. The current leakage detection system of claim 8, further comprising:
- a battery magnetic core disposed on a side where the high voltage battery is disposed with response to a point at which the main bus terminal is branched toward the electric load, and including a charging/discharging wiring for charging or discharging the high voltage battery therein; and
- a battery hall sensor configured to sense a magnetic field induced in the battery magnetic core, wherein the detection unit is configured to detect whether there is a current leakage in the high voltage battery based on a magnitude of the magnetic field sensed by the battery hall sensor.

10. The current leakage detection system of claim 9, further comprising:
- a measurement unit configured to measure a combined insulation resistance of the fuel cell, the high voltage battery and the electric load, wherein if the combined insulation resistance measured by the measurement unit is equal to or less than a predetermined resistance and no current leakage is detected in the electric load and the high voltage battery, the detection unit is configured to detect that a current leakage has occurred in the fuel cell.

11. The current leakage detection system of claim 4, further comprising:
- a cutoff controller configured to cut off power supply from the main bus terminal to the electric load when the detection unit detects a current leakage in the electric load.

* * * * *